(12) United States Patent
Hu et al.

(10) Patent No.: US 10,468,367 B2
(45) Date of Patent: Nov. 5, 2019

(54) SOLDER IN CAVITY INTERCONNECTION STRUCTURES

(71) Applicant: INTEL CORPORATION, Santa Clara, CA (US)

(72) Inventors: Chuan Hu, Chandler, AZ (US); Shawna M. Liff, Gilbert, AZ (US); Gregory S. Clemons, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/884,167

(22) Filed: Jan. 30, 2018

(65) Prior Publication Data

US 2018/0151529 A1 May 31, 2018

Related U.S. Application Data

(60) Continuation of application No. 15/009,206, filed on Jan. 28, 2016, now abandoned, which is a division of
(Continued)

(51) Int. Cl.
*H01L 23/00* (2006.01)
*H05K 1/18* (2006.01)
(Continued)

(52) U.S. Cl.
CPC ............ *H01L 24/17* (2013.01); *H01L 21/563* (2013.01); *H01L 23/3121* (2013.01);
(Continued)

(58) Field of Classification Search
None
See application file for complete search history.

(56) References Cited

U.S. PATENT DOCUMENTS

| 5,146,674 A | 9/1992 | Frankeny et al. |
| 5,313,021 A | 5/1994 | Sajja et al. |

(Continued)

FOREIGN PATENT DOCUMENTS

| EP | 1022774 | 7/2000 |
| JP | 08-023147 | 1/1996 |

(Continued)

OTHER PUBLICATIONS

Decision on Appeal Against Final rejection for Korean Patent Application No. 10-2010-130907, dated Dec. 20, 2013.
(Continued)

*Primary Examiner* — Long Pham
(74) *Attorney, Agent, or Firm* — Green, Howard & Mughal LLP

(57) ABSTRACT

The present disclosure relates to the field of fabricating microelectronic packages, wherein cavities are formed in a dielectric layer deposited on a first substrate to maintain separation between soldered interconnections. In one embodiment, the cavities may have sloped sidewalls. In another embodiment, a solder paste may be deposited in the cavities and upon heating solder structures may be formed. In other embodiments, the solder structures may be placed in the cavities or may be formed on a second substrate to which the first substrate may be connected. In still other embodiments, solder structures may be formed on both the first substrate and a second substrate. The solder structures may be used to form solder interconnects by contact and reflow with either contact lands or solder structures on a second substrate.

11 Claims, 11 Drawing Sheets

Related U.S. Application Data application No. 14/643,329, filed on Mar. 10, 2015, now Pat. No. 9,530,747, which is a continuation of application No. 13/740,698, filed on Jan. 14, 2013, now Pat. No. 9,006,890, which is a division of application No. 13/069,601, filed on Mar. 23, 2011, now Pat. No. 8,936,967.

(51) Int. Cl.
   *H01L 21/56* (2006.01)
   *H01L 23/31* (2006.01)
   *H01L 23/498* (2006.01)

(52) U.S. Cl.
   CPC .... *H01L 23/3142* (2013.01); *H01L 23/49816* (2013.01); *H01L 24/11* (2013.01); *H01L 24/81* (2013.01); *H05K 1/181* (2013.01); *H01L 24/13* (2013.01); *H01L 24/16* (2013.01); *H01L 24/29* (2013.01); *H01L 24/32* (2013.01); *H01L 2224/10126* (2013.01); *H01L 2224/10135* (2013.01); *H01L 2224/10156* (2013.01); *H01L 2224/1131* (2013.01); *H01L 2224/11332* (2013.01); *H01L 2224/11334* (2013.01); *H01L 2224/11849* (2013.01); *H01L 2224/13021* (2013.01); *H01L 2224/13111* (2013.01); *H01L 2224/1624* (2013.01); *H01L 2224/16111* (2013.01); *H01L 2224/16113* (2013.01); *H01L 2224/16145* (2013.01); *H01L 2224/16225* (2013.01); *H01L 2224/16227* (2013.01); *H01L 2224/16238* (2013.01); *H01L 2224/2929* (2013.01); *H01L 2224/73103* (2013.01); *H01L 2224/73104* (2013.01); *H01L 2224/73203* (2013.01); *H01L 2224/73204* (2013.01); *H01L 2224/81139* (2013.01); *H01L 2224/81191* (2013.01); *H01L 2224/81193* (2013.01); *H01L 2224/81203* (2013.01); *H01L 2224/81424* (2013.01); *H01L 2224/81439* (2013.01); *H01L 2224/81447* (2013.01); *H01L 2224/81455* (2013.01); *H01L 2224/81805* (2013.01); *H01L 2224/81815* (2013.01); *H01L 2224/83192* (2013.01); *H01L 2924/00011* (2013.01); *H01L 2924/00012* (2013.01); *H01L 2924/014* (2013.01); *H01L 2924/0105* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01082* (2013.01); *H01L 2924/01322* (2013.01); *H01L 2924/0665* (2013.01)

(56) References Cited

U.S. PATENT DOCUMENTS

| | | | |
|---|---|---|---|
| 5,586,715 | A | 12/1996 | Schwiebert et al. |
| 5,658,827 | A | 8/1997 | Aulicino et al. |
| 5,889,326 | A | 3/1999 | Tanaka |
| 5,977,632 | A | 11/1999 | Beddingfield |
| 6,190,940 | B1 | 2/2001 | DeFelice et al. |
| 6,320,254 | B1 | 11/2001 | Liou et al. |
| 6,583,517 | B1 | 6/2003 | Jimarez |
| 6,622,907 | B2 | 9/2003 | Fanti et al. |
| 6,921,860 | B2 | 7/2005 | Peterson et al. |
| 7,459,386 | B2 | 12/2008 | Tseng et al. |
| 8,424,748 | B2 | 4/2013 | Hu |
| 2003/0009878 | A1 | 1/2003 | Gregory |
| 2005/0215044 | A1 | 9/2005 | Huang |
| 2006/0050753 | A1 | 3/2006 | Ogura |
| 2007/0040272 | A1 | 2/2007 | Sheats |
| 2007/0269973 | A1 | 11/2007 | Nalla et al. |
| 2008/0003802 | A1 | 1/2008 | Pang et al. |
| 2008/0023829 | A1 | 1/2008 | Kok et al. |
| 2008/0157353 | A1* | 7/2008 | Watanabe ........... H01L 23/3128 257/734 |
| 2009/0218688 | A1 | 9/2009 | Ayotte et al. |
| 2010/0000775 | A1 | 1/2010 | Shen et al. |
| 2010/0230475 | A1* | 9/2010 | Buchwalter ........... H01L 21/563 228/179.1 |
| 2011/0147440 | A1 | 6/2011 | Hu |
| 2012/0241965 | A1 | 9/2012 | Hu et al. |
| 2013/0128484 | A1 | 5/2013 | Hu et al. |
| 2013/0206820 | A1 | 8/2013 | Hu |
| 2014/0240943 | A1 | 8/2014 | Hu |

FOREIGN PATENT DOCUMENTS

| | | |
|---|---|---|
| JP | 2000-216194 | 8/2000 |
| WO | 2012129153 | 9/2012 |
| WO | 2012129153 A3 | 12/2012 |

OTHER PUBLICATIONS

Final Office Action for U.S. Appl. No. 15/009,206, notified Apr. 19, 2017.
Final Office Action for U.S. Appl. No. 14/643,329, notified on Jun. 10, 2016.
International Preliminary Report on Patentability for PCT Patent Application No. PCT/US12/29617, dated Oct. 3, 2013, 8 pages.
International Search Report and Written Opinion for PCT Patent Application No. PCT/US12/29617, dated Oct. 29, 2012, 11 pages.
Non-Final Office Action for U.S. Appl. No. 13/069,601, dated May 25, 2012.
Non-Final Office Action for U.S. Appl. No. 13/740,698, dated Jul. 30, 2014.
Notice of Allowance mailed for U.S. Appl. No. 14/643,329, notified on Aug. 26, 2016.
Notice of Allowance for U.S. Appl. No. 13/069,601, dated Sep. 26, 2014.
Notice of Allowance for U.S. Appl. No. 13/740,698, dated Dec. 22, 2014.
Office Action for Chinese Patent Application No. 201010621012.8, dated Feb. 26, 2016.
Office Action for Chinese Patent Application No. 201010621012.8, dated Mar. 14, 2013.
Office Action for Chinese Patent Application No. 201010621012.8, dated Mar. 27, 2015.
Office Action for Chinese Patent Application No. 201010621012.8, dated May 30, 2014.
Office Action for Chinese Patent Application No. 201010621012.8, dated Nov. 22, 2013.
Office Action for Chinese Patent Application No. 201010621012.8, dated Nov. 9, 2015.
Office Action for Korean Patent Application No. 10-2010-130907, dated Feb. 10, 2012.
Office Action for Korean Patent Application No. 10-2010-130907, dated Mar. 25, 2013.
Office Action for Korean Patent Application No. 10-2010-130907, dated Sep. 27, 2012.
Office Action for Taiwan Patent Application No. 099137763, dated Jul. 17, 2015.
Office Action for Taiwan Patent Application No. 101109702, dated Apr. 24, 2014.
Office Action for Taiwan Patent Application No. 104142718, dated Oct. 3, 2016.
Office Action for Taiwan Patent Application No. 106127638 dated Dec. 8, 2017.
Office Action for U.S. Appl. No. 15/009,206 notified Oct. 10, 2017.
Office Action for U.S. Appl. No. 15/009,206, notified on Oct. 12, 2016.
Office Action for U.S. Appl. No. 14/643,329 notified on Feb. 5, 2016.
Office Action for U.S. Appl. No. 13/069,601, dated May 22, 2014.

(56) References Cited

OTHER PUBLICATIONS

Restriction Requirement for U.S. Appl. No. 14/643,329, dated Oct. 2, 2015.
Restriction Requirement for U.S. Appl. No. 13/069,601 dated Dec. 9, 2011.
Baumgartner, et al., "Printing Solder Paste in Dry Film—A Low Cost Fine-Pitch Bumping Technique", 9th Electronics Packaging Technology Conference, IEEE, ISBN: 978-1-4244-1323-2, Dec. 10-12, 2007, pp. 609-612.

* cited by examiner

SOLDER IN CAVITY INTERCONNECTION STRUCTURES

CROSS REFERENCE TO RELATED APPLICATIONS

The present application is a continuation of U.S. patent application Ser. No. 15/009,206, filed Jan. 28, 2016, which is a divisional of U.S. patent application Ser. No. 14/643,329, filed Mar. 10, 2015, now U.S. Pat. No. 9,530,747, which is a continuation of U.S. patent application Ser. No. 13/740,698, filed Jan. 14, 2013, now U.S. Pat. No. 9,006,890, which is a divisional of U.S. patent application Ser. No. 13/069,601, filed Mar. 23, 2011, now U.S. Pat. No. 8,936,967.

BACKGROUND

A typical microelectronic package includes at least one substrate, such as a microelectronic die, that is mounted to another substrate, such as an interposer or a printed circuit board, wherein bond pads on one substrate are attached to corresponding contact lands on the other substrate using reflowable solder materials.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
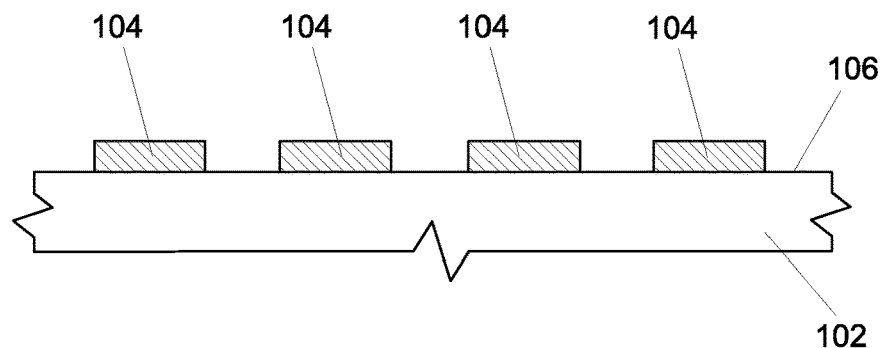
FIGS. 1-4 illustrate side cross-sectional views of a process of forming a cavity structure, according to one embodiment of the present disclosure.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of fabricating microelectronic packages, wherein cavities are formed in a dielectric layer deposited on a first substrate to maintain separation between soldered interconnections. In one embodiment, the cavities may have sloped sidewalls. In another embodiment, a solder paste may be deposited in the cavities and upon heating solder structures may be formed. In other embodiments, the solder structures may be placed in the cavities or may be formed on a second substrate to which the first substrate may be connected. In still other embodiments, solder structures may be formed on both the first substrate and a second substrate. The solder structures may be used to form solder interconnects by contact and reflow with either contact lands or solder structures on a second substrate. In some cases, the cavities can reduce bridging or cracking failures of the solder connections, and may permit smaller interconnection pitch. Additionally, in some cases, the reliability of the connections may be improved. Furthermore, the walls of the cavities may be used to strengthen or support the solder joints, particularly in response to lateral loading.

In the production of microelectronic packages, microelectronic dice are generally mounted on substrates that may, in turn, be mounted to boards, which provide electrical communication routes between the microelectronic dice and external components. A microelectronic die, such as a microprocessor, a chipset, a graphics device, a wireless device, a memory device, an application specific integrated circuit, or the like, may be attached to a substrate, such as an interposer, a motherboard, and the like, through a plurality of interconnects, such as reflowable solder bumps or balls, in a configuration generally known as a flip-chip or controlled collapse chip connection ("C4") configuration. When the microelectronic die is attached to the substrate with interconnects made of solder, the solder is reflowed (i.e. heated) to secure the solder between the microelectronic die bond pads and the substrate bond pads. The microelectronic die may also be attached with a thermo-compression bonding process to form an interconnection between an attachment structure of the microelectronic die and the substrate bond pad, as will be understood to those skilled in the art.

While C4 connections have been widely utilized in the microelectronic industry; there is a continuing desire to increase the density of interconnections that can be formed. The more interconnections per unit of area that can be formed, the smaller the resulting microelectronic devices can be. In general, the smaller the microelectronic device, the lower their cost and the greater their performance.

FIGS. 1-9 illustrate an embodiment of forming a microelectronic structure according to at least one embodiment of the present disclosure. FIG. 1 shows a first substrate 102, which may include an integrated circuit wafer, a printed circuit board, an interposer, a microelectronic die, or a microelectronic device package. The first substrate 102 may include at least one attachment structure, such as a plurality of bond pads 104 adjacent a contact surface 106 thereof. The first substrate bond pads 104 may be any appropriate conductive material, including but not limited to copper, aluminum, nickel, silver, and alloys thereof, and may be in electric communication with integrated circuits, contacts, traces, and/or the like (not shown) within the first substrate 102, as will be understood to those skilled in the art.

Figure 2:
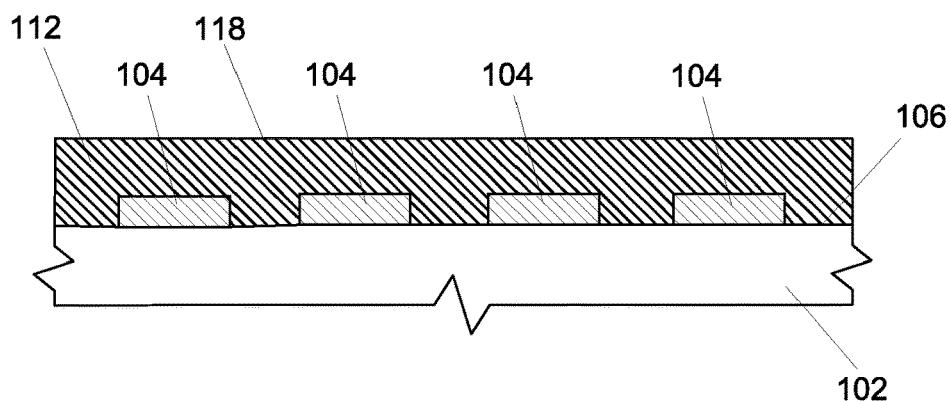

As shown in FIG. 2, a dielectric layer 112 may be formed over the first substrate bond pads 104 and the first substrate contact surface 106. In one embodiment, the dielectric layer 112 may include, but is not limited to, a photo-definable layer or a dry film. In one embodiment, the dielectric layer 112 may be a negative tone chemically amplified photoresist, which can be epoxy-based, novolak-based, polyimide-based, or the like. The dielectric layer 112 may be formed by any technique known in the art, including but not limited to imprinting, paste printing, laminating, and spin coating.

Figure 3:
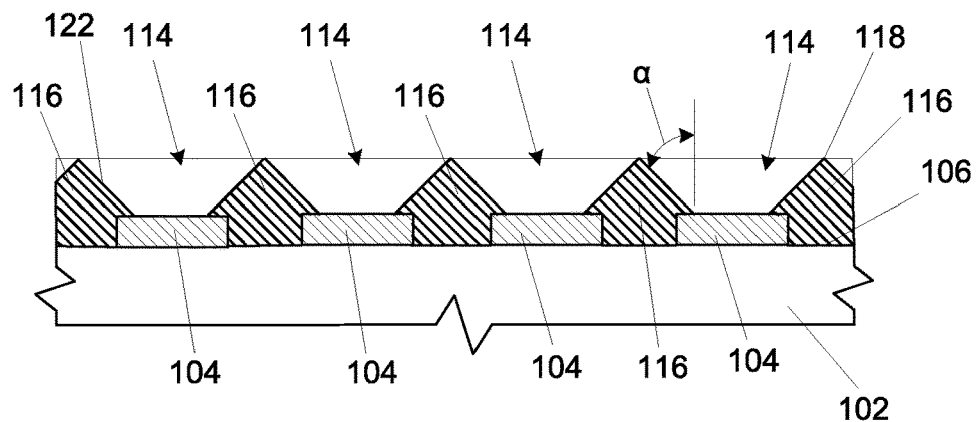
Figure 4:
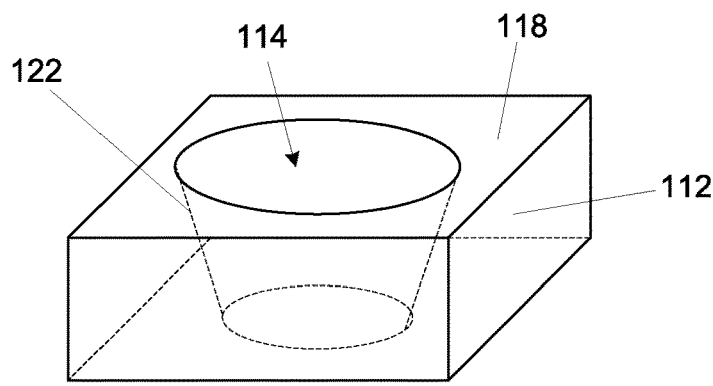

As shown in FIG. 3, cavities 114 may be formed through the dielectric layer 112 which expose at least portion of each first substrate bond pads 104, as shown in FIG. 3. As further shown in FIG. 3, the cavities 114 may be directly adjacent to one another. In one embodiment, the cavities 114 may be formed the dielectric layer 112 by any known techniques, including but not limited to patterning and etching with a lithography technique. As a result of forming the cavities 114, intervening inter-cavity walls 116 are formed between the cavities 114 from the remaining dielectric layer 112 (see FIG. 2).

As still further shown in FIG. 3, one embodiment of the present disclosure the inter-cavity walls 116 may be defined by sloped sidewalls 122, such that the cavities 114 are wider at an outer surface 118 of the dielectric layer 112 (see FIG. 2) than proximate the first substrate bond pads 104. In one embodiment of the present description, the sidewalls may have an angle α of between about 10 and 60 degrees from perpendicular from the first substrate contact surface 106. In an embodiment, the cavities 114 may be substantially conical, such as the truncated conical shape shown in FIG. 4.

Figure 5:
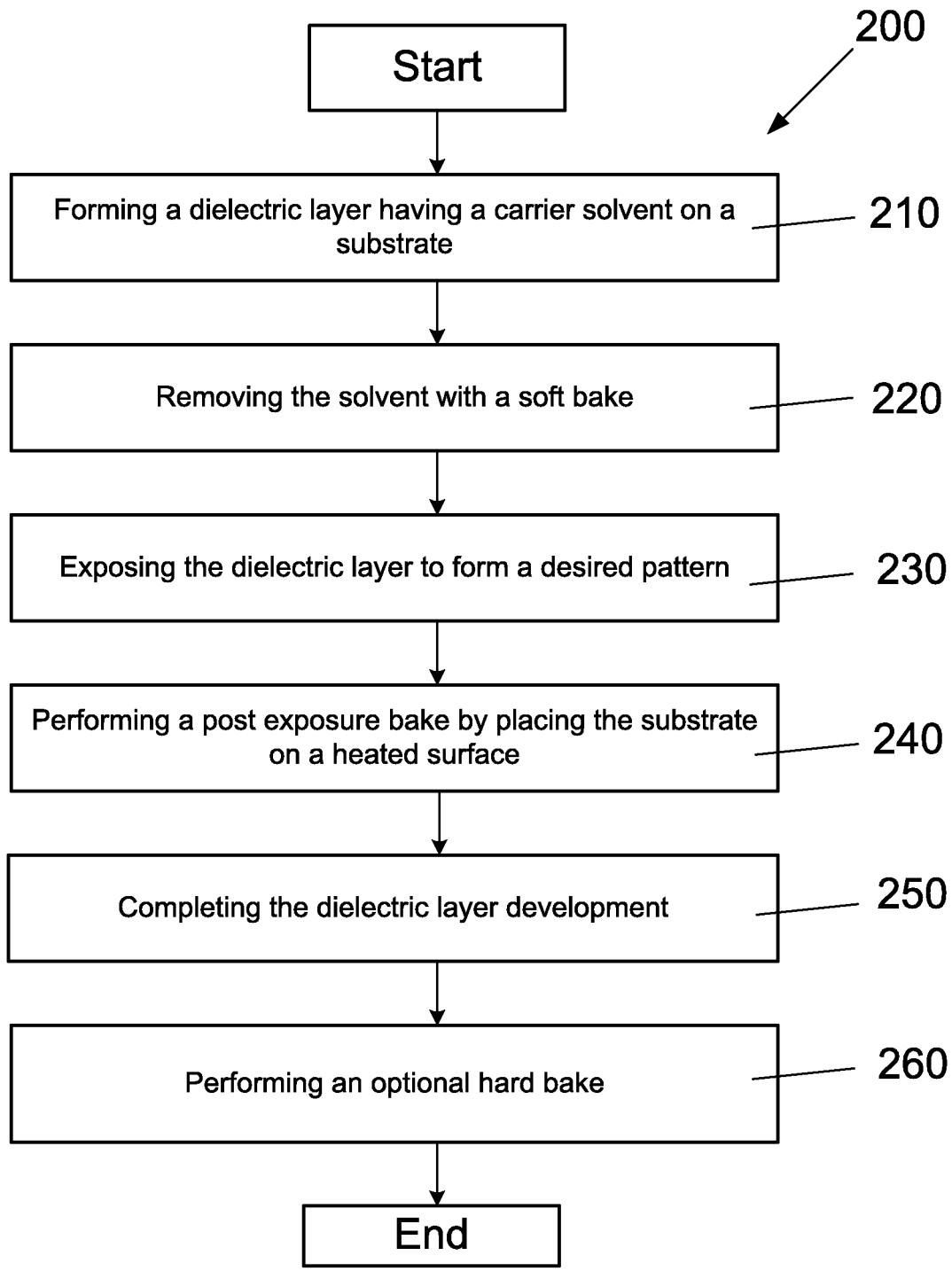
FIG. 5 is a flow diagram of a process of forming a solder in cavity interconnection structure, according to the present disclosure.

FIG. 5 illustrates a flow diagram of one process 200 of forming sloped sidewalls 122 of the present application. As shown in block 210, a dielectric layer, such as a negative tone chemically amplified photoresist, may be formed with a carrier solvent on a substrate. The solvent may be removed in a soft bake, usually between about 90 and 100 degrees C., as shown in block 220. As shown in block 230, the dielectric layer may be exposed to form a desired pattern, such as by a standard lithographic techniques. As shown in block 240, a post exposure bake may be performed by placing the substrate on a heated surface. By using a heated surface and by tuning the post exposure bake temperature and duration, it may be possible to create a gradient in cross-link density and/or number that may substantially correspond to the thermal gradient across the substrate. For example, when the dielectric material is a resist material, the dielectric material closest to the heated surface can become more cross-linked and/or a photo-acid within the dielectric material diffuses into areas that are not exposed and continues cross-linking while the dielectric material farthest away from the heated surface can become less cross-linked or the diffusion of the photo-acid is limited. As shown in block 250, the dielectric layer development may be completed, which includes curing the electric material and removing dielectric material to form the cavities. In one embodiment, due to the densification and/or diffusion gradient of photo-acid, it is possible to form sloped sidewalls in the cavities upon the development of the dielectric material. In other words, more dielectric material is removed from the top of the dielectric layer, while less material is removed from the dielectric material closest to the heated surface. As shown in block 260, an optional hard bake may be performed. In another embodiment, the cross-link density, the shrinkage of the dielectric material, and the coefficient of thermal expansion may be modulated by adjusting the ramp rate to and the magnitude of the high temperature cure. This may be particular applicable to polyimide-based materials, which can exhibit shrinkage of greater than 10%. Consequently, the greater the shrinkage or the higher the coefficient of thermal expansion, the larger the contraction. Thus, when a thick dielectric layer is patterned to have perpendicular sidewalls, the dielectric material in contact with the rigid substrate exhibits the patterned opening critical dimension while the dielectric material furthest from the substrate contracts unconstrained and forms a wide opening, which results in sloped sidewalls.

Figure 6:
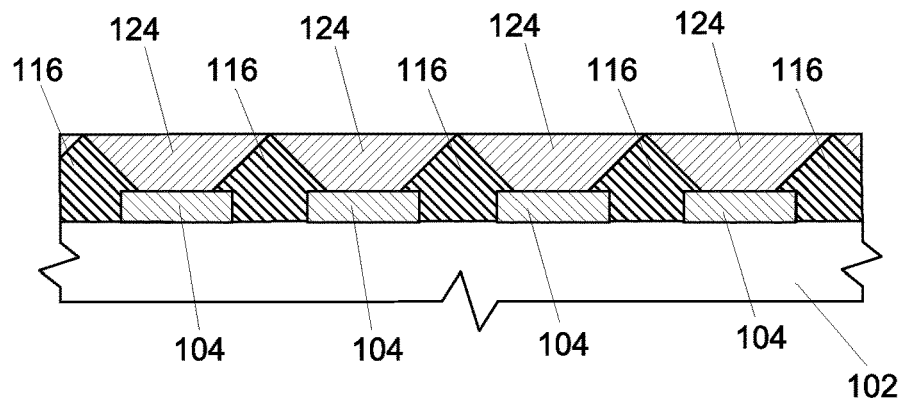
FIGS. 6-9 illustrate side cross-sectional views of a process of forming a solder in cavity interconnection structure, according to one embodiment of the present disclosure.

As shown in FIG. 6, the cavities 114 (see FIG. 3) may act as a mold for printing of solder paste 124, wherein the solder paste 124 is deposited within the cavities 114 (see FIG. 3). Any known technique for depositing the solder paste 124 may be utilized, as will be understood to those skilled in the art. The solder paste 124 may be any known solder paste, including, but not limited to micro-balls of solder powder dispersed in a flux matrix.

Figure 7:
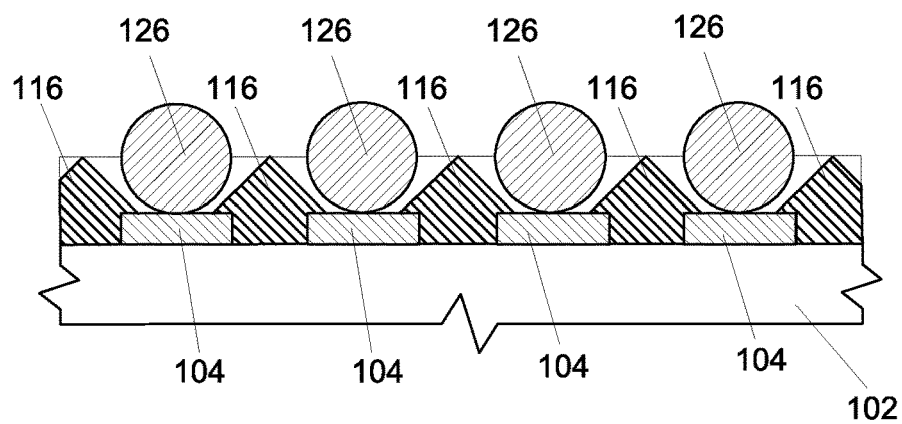

As shown in FIG. 7, the solder paste 124 (see FIG. 5) is heated to about its melting temperature, referred to as "reflow". This results in the solder paste 124 substantially taking on a hemispherical shape, referred to as a solder ball (shown in FIG. 7) or forming a curved structure with a flattened surface adjacent to the first substrate bond pad 104 (shown in FIG. 18). These spheres and curved structures will be collectively referred to as "solder structures 126". The shape taken on by the solder structures 126 is dependent, at least in part, by the cohesive force of the solder material itself and by the surface energy between the solder material and the first substrate bond pad 104. During the reflow process, the flux matrix within the solder paste 124 may be volatized to leave solder material behind, which forms the solder structures 126. Thus, the volume of the solder paste 124 will be greater than the volume of the solder structures 126. Therefore, the slope in the sidewalls 122 may also allow for an appropriate volume of solder paste 124 to form a desired solder structure 126 size.

The solder structures 126 may be any appropriate material, including but not limited to lead/tin alloys, such as tin/lead solder, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys.

It is understood that the solder structures 126 could be placed in the cavities 114 by microball printing, thereby by-passing the solder paste printing and reflowing processes to form the solder structures 126, previously described.

Figure 8:
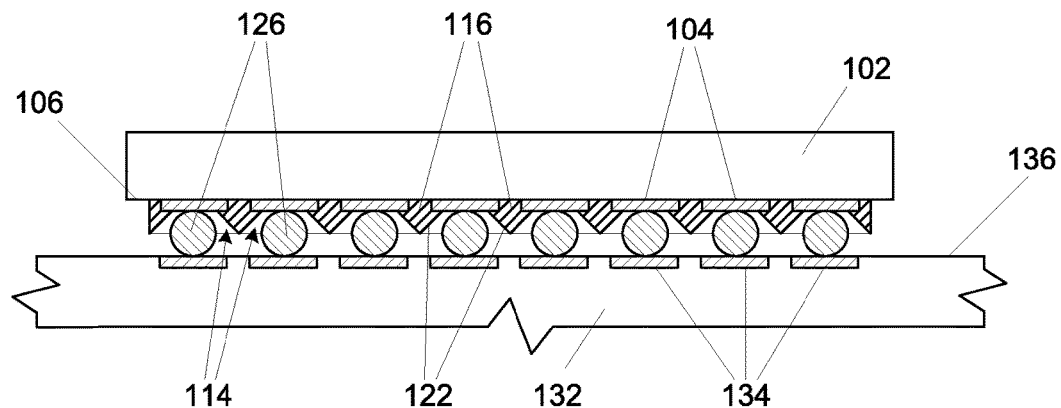

As shown in FIG. 8, the solder structures 126 of the first substrate 102 may be brought into contact with contact lands 134 proximate a contact surface 136 of a second substrate 132, wherein the pattern or distribution of the second substrate contact lands 134 may be a substantial mirror-image to the pattern or distribution of the first substrate bond pads 104. The second substrate 132 may be, but is not limited to, an integrated circuit wafer, a printed circuit board, an interposer, a microelectronic die, a microelectronic device package, or the like. The second substrate contact lands 134 may be any appropriate conductive material, including but not limited to copper, aluminum, nickel, silver, and alloys thereof, and may be in electric communication with integrated circuits, contacts, traces, and/or the like (not shown) within the second substrate 132, as will be understood to those skilled in the art.

Figure 9:
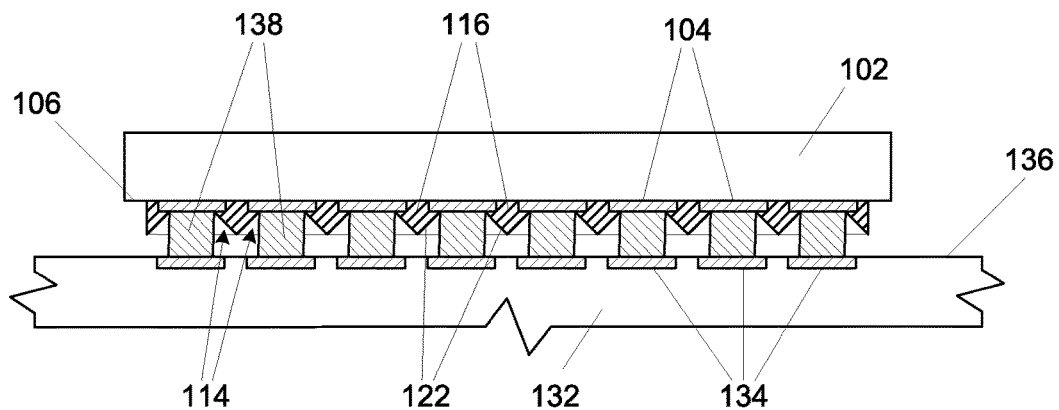

As shown in FIG. 9, in one embodiment, the solder structures 126 may be substantially heated to their reflow temperature, then cooled to resolidify, thereby forming a solder interconnects 138 between the first substrate bond pads 104 and the second substrate contact lands 134, which attaches the first substrate 102 to the second substrate 132. In another embodiment, thermal compression bonding (e.g. pressure and heat) may be used to form the solder interconnects 138 and attach the first substrate 102 to the second substrate 132, as will be understood to those skilled in the art.

Figure 10:
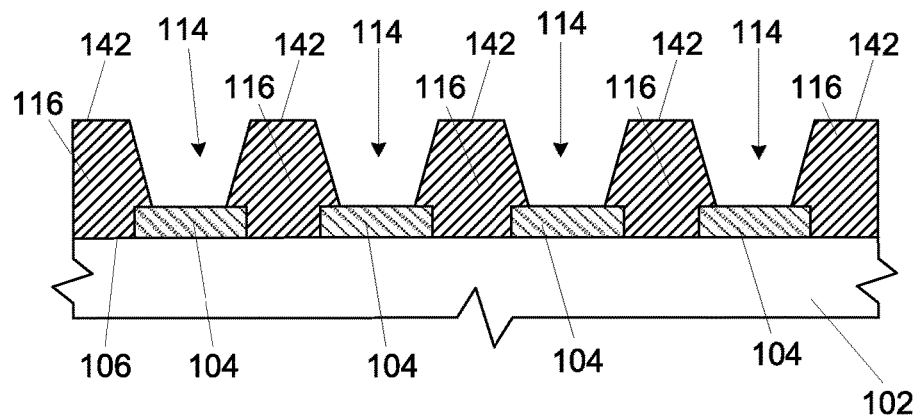
FIGS. 10-12 illustrate side cross-sectional views of a process of forming a solder in cavity interconnection structure, according to another embodiment of the present disclosure.

In another embodiment of the present description illustrated in FIG. 10, the first substrate 102 may be formed with the bond pads 104 adjacent the first substrate contact surface 106, as previously described. The dielectric layer 112 may be formed over the first substrate contact surface 106, then patterned and etched to form the cavities 114. The cavities 114 may be formed such that the intervening inter-cavity walls 116 have sloped sidewalls 122, as previously discussed. The intervening inter-cavities walls 116 may also include contact structures 142 formed between each of the adjacent cavities 114, wherein the inter-cavity wall contact surfaces 142 may be substantially planar to the first substrate contact surface 106.

Figure 11:
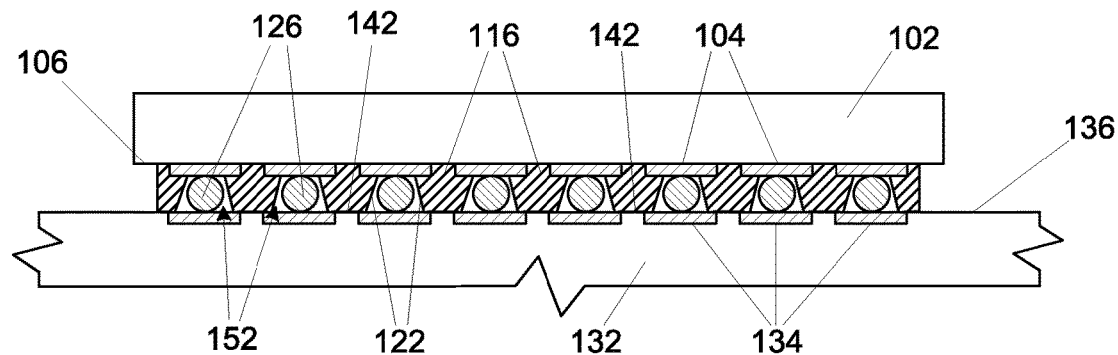

As shown in FIG. 11, solder structures 126 may be formed within the cavities 114 in a manner or manners previously discussed, wherein the solder structures 126 may be contained completely within the cavities 114. As further shown in FIG. 11, the solder structures 126 of the first substrate 102 may be aligned with the contact lands 134 on a second substrate 132, wherein the contact surfaces 142 of the intervening inter-cavities walls 116 contact the second substrate contact surface 136.

Figure 12:
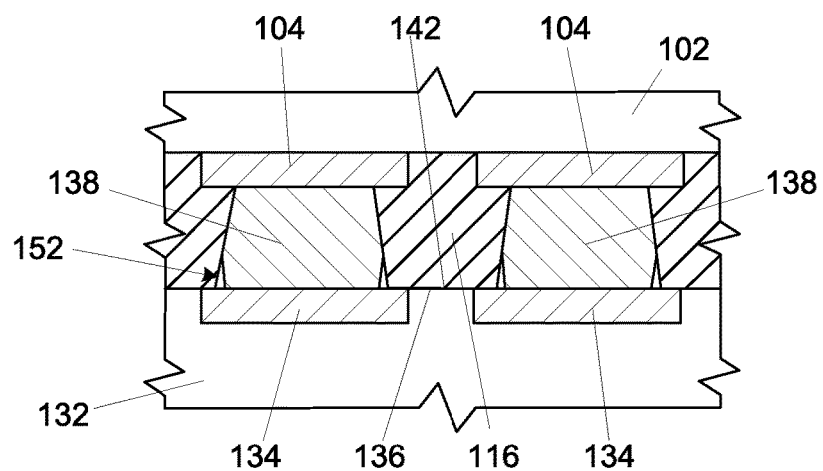

When the attachment process is performed, such as reflow or thermal compressive bonding, the dielectric material 112 deforms to substantially fill gaps 152 (see FIG. 11) between the solder interconnections 138 and the inter-cavity walls 116, as shown in FIG. 12. In one embodiment, the dielectric material of the inter-cavity walls 116 is sufficiently deformable to substantially fill the gaps 152 (see FIG. 11) between the solder interconnections 138 and the dielectric material 112. In another embodiment, the dielectric material of the inter-cavity walls 116 may flow during the attachment process (e.g. when heat is applied) to substantially fill the gaps 152 (see FIG. 11) between the solder interconnections 138 and the inter-cavity walls 116.

Figure 13:
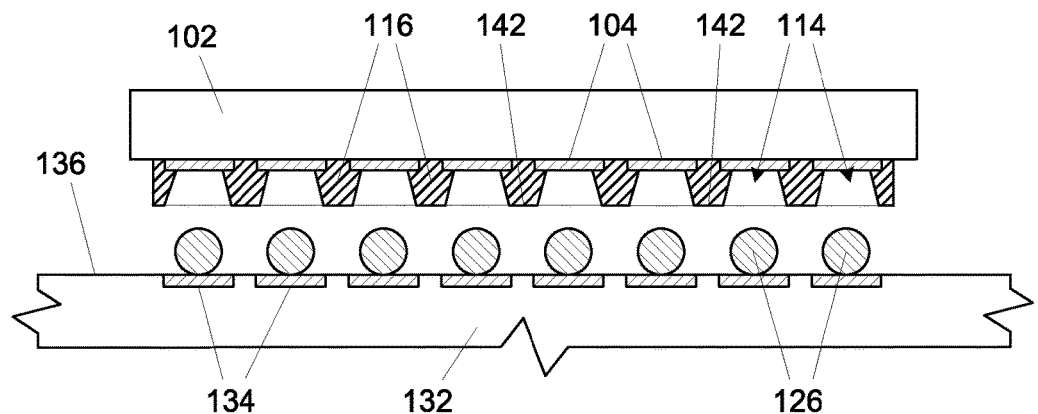
FIG. 13 illustrates a side cross-sectional view of still another embodiment of forming a solder in cavity interconnection structure, according to the present disclosure.

In another embodiment shown in FIG. 13, the solder structure 126 may be formed on the second substrate contact lands 134 by any technique known in the art. After the attachment process, a structure similar to the structures shown in FIG. 9 or FIG. 12 may be formed.

Figure 14:
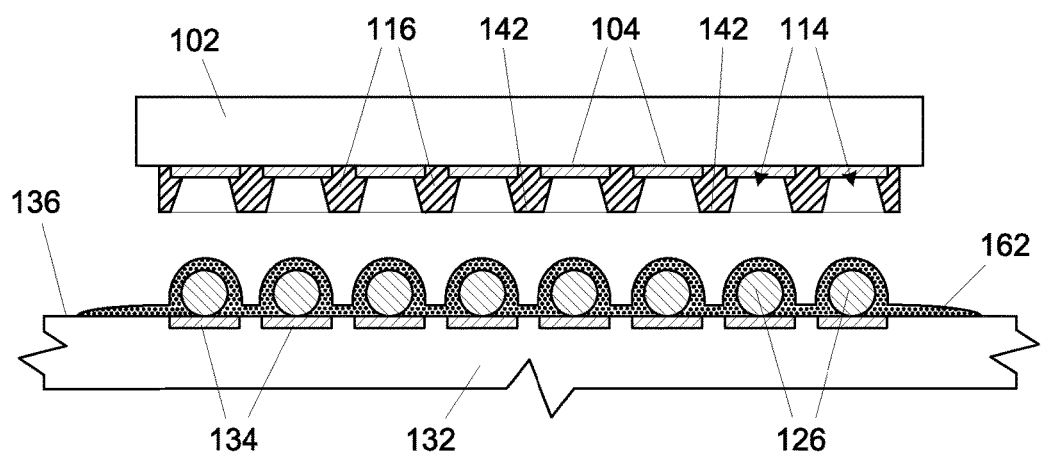
FIG. 14 illustrates a side cross-sectional view of an embodiment of forming a solder in cavity interconnection structure utilizing an underfill material, according to the present disclosure.

In still another embodiment shown in FIG. 14, the embodiment of FIG. 13 may have an underfill material 162, such as an epoxy material (with or without flux) or a no-flow underfill (NFU) material, deposited over the second substrate contact surface 136, a portion of the second substrate contact lands 134, and the solder structures 126. The underfill material 162 may assist in filling any voids 152 between the dielectric layer 112 and the solder interconnections 136 (see FIG. 11).

Figure 15:
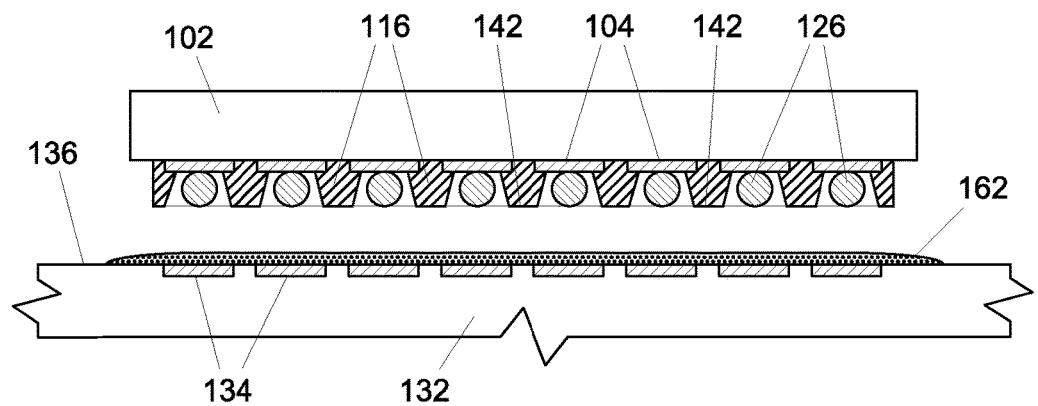
FIG. 15 illustrates a side cross-sectional view of another embodiment of forming a solder in cavity interconnection structure utilizing an underfill material, according to the present disclosure.

In another embodiment shown in FIG. 15, the underfill material 162 may be deposited over the second substrate contact surface 136 and the second substrate contact lands 134 for embodiments, such as shown in FIGS. 1-12. The underfill material 162 may fill space between the first substrate 102 and the second substrate 132 (see FIG. 8) or may assist in filling any voids between the dielectric layer 112 and the solder interconnections 136 (see FIGS. 9 and 11).

Figure 16:
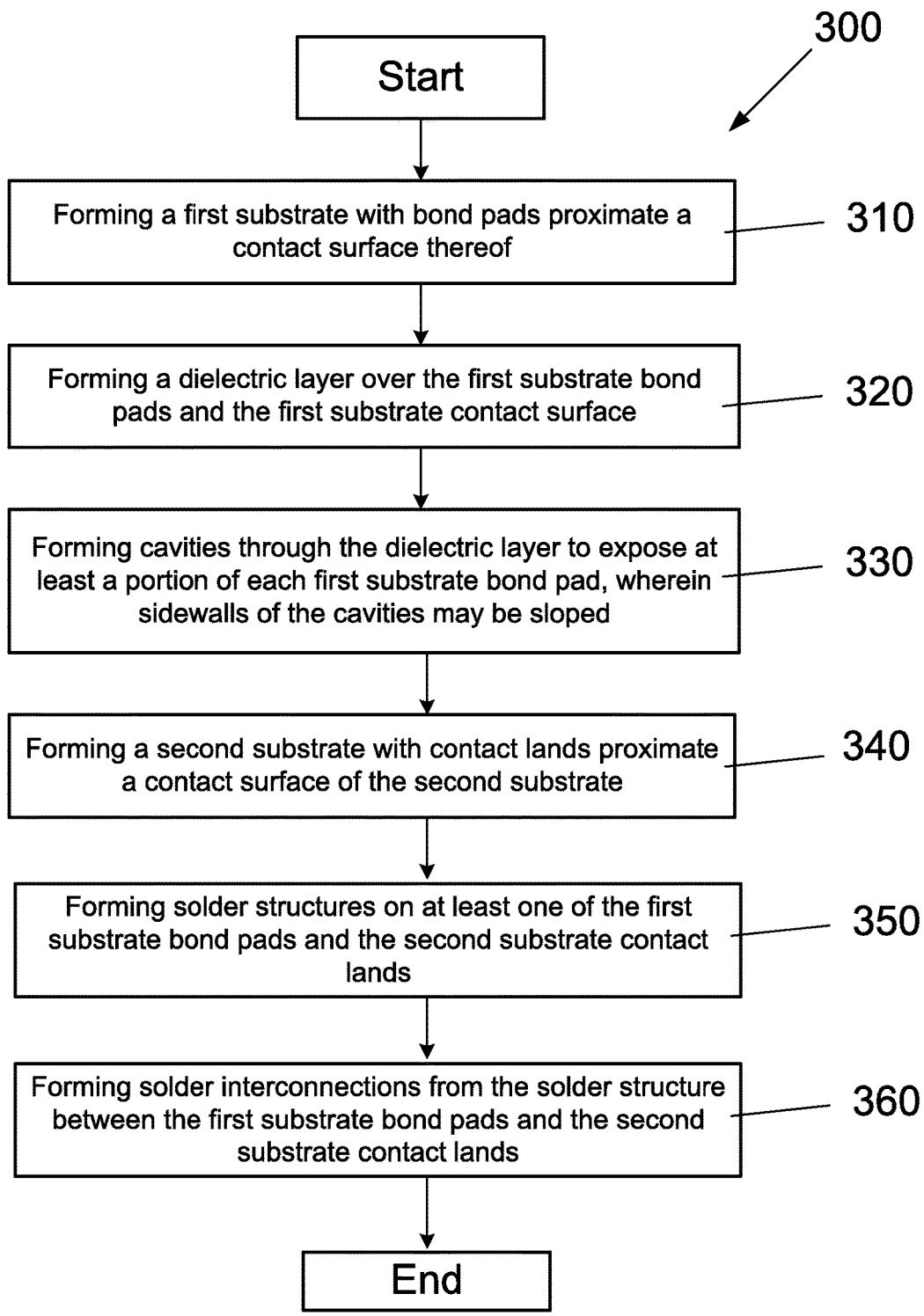
FIG. 16 is a flow diagram of a process of forming a solder in cavity interconnection structure, according to the present disclosure.

An embodiment of a process of the present description is illustrated in the flow diagram 300 of FIG. 16. As defined in block 310, a first substrate may be formed with bond pads proximate a contact surface thereof. A dielectric layer may be formed over the first substrate bond pads and the first substrate contact surface, as defined in block 320. As defined in block 330, cavities may be formed through the dielectric layer to expose at least a portion of each first substrate bond pad, wherein the sidewalls of the cavities are sloped, such that the cavities are wider at an outer surface of the dielectric layer than proximate the first substrate bond pads. As defined in block 340, a second substrate may be formed with contact lands proximate a contact surface of the second substrate. As defined in block 350, solder structures may be formed on at least one of the first substrate bonds and the second substrate contact lands. As defined in block 360, solder interconnections may be formed from the solder structures between the first substrate bond pads and the second substrate contact lands.

Figure 17:
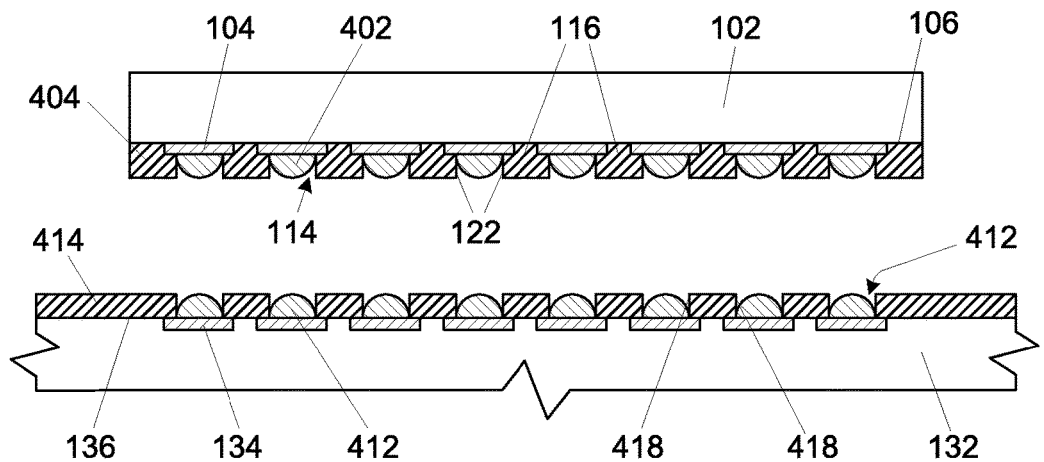
FIGS. 17-20 illustrate side cross-sectional views of a process of forming a solder in cavity interconnection structure, according to still another embodiment of the present disclosure.

In one embodiment illustrated in FIGS. 17-20, the interconnection structures may be formed from first solder structures 402 on the first substrate 102 and second solder structures 412 on the second substrate 132. As shown in FIG. 17, the first solder structures 402 are formed in cavities 114 in a first dielectric layer 404 in a manner previously discussed. It is noted that the inter-cavity wall sidewalls 122 for the cavities 114 are show as substantially perpendicular to the first substrate contact surface 106; however, they may be formed to be sloped, as previously discussed. The second solder structures 412 may be formed on the contact lands 134 on the contact surface 136 of the second substrate 132. The second solder structures 412 may be formed by forming a second dielectric layer 414, such as a solder mask photoresist material, on second substrate contact surface 136. The second dielectric layer 414 may be patterned and etched to form openings 416 to expose at least portion of each of the second substrate contact lands 134. The second solder structures 412 may then be formed in the openings 416 by any known technique, including as those which have been previously discussed. It is noted that sidewalls 418 for the openings 416 are show as substantially perpendicular to the second substrate contact surface 136; however, they may be formed to be sloped, as previously discussed.

Figure 18:
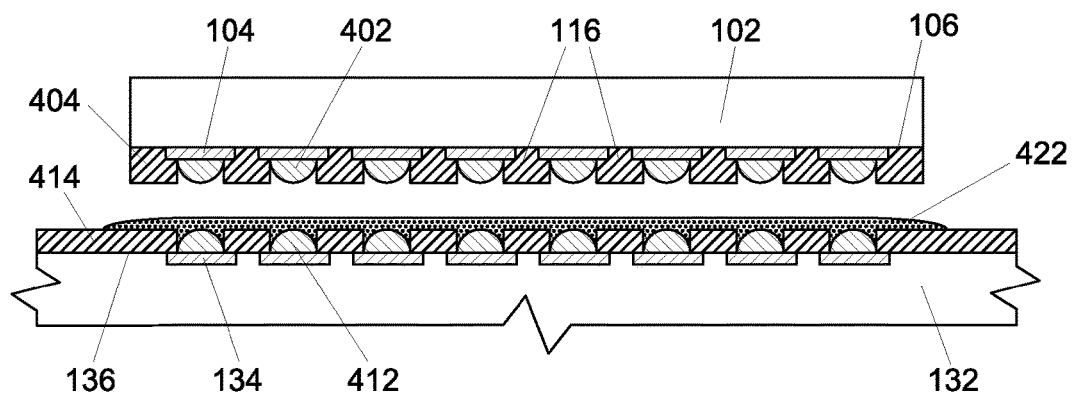
Figure 19:
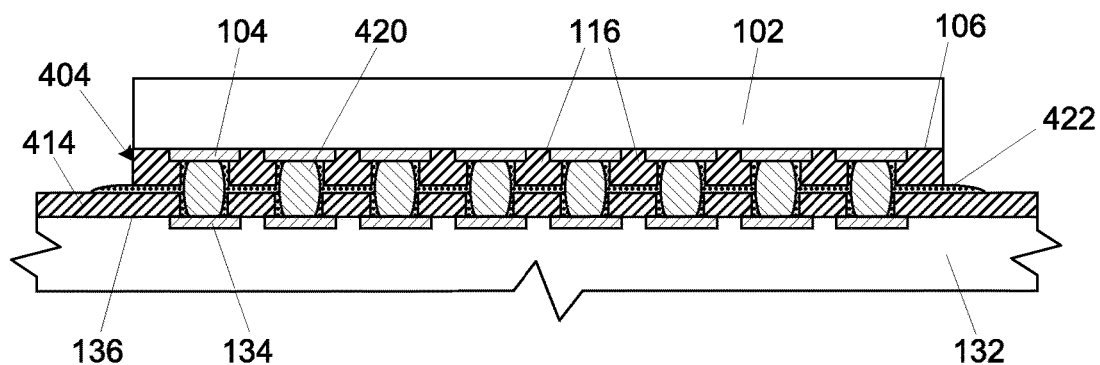
Figure 20:
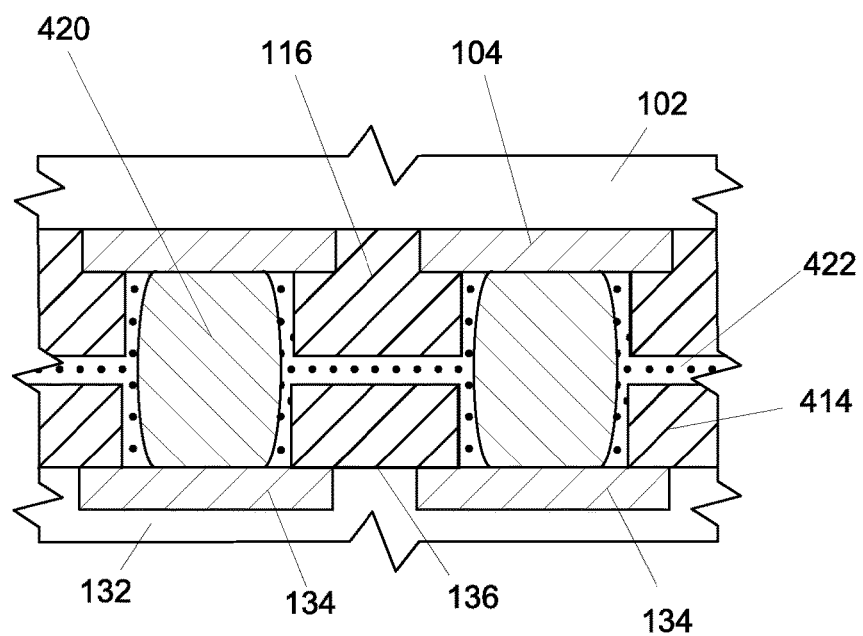

As shown in FIG. 18, an underfill material 422 may be de deposited over the second dielectric layer 414 and the second solder structures 412. The first solder structures 402 may then be brought into contact with their corresponding second solder structures 412 and attached to one another by any known technique, including but not limited to reflow or thermal compression bonding, to form solder interconnections 420, as shown in FIG. 19. The underfill material 422 may flow to fill any voids between the solder interconnections 420 and the first dielectric layer 404, between the solder interconnections 420 and the second dielectric layer 414, and between the first dielectric layer 404 and the second dielectric layer 414, as shown in FIG. 20.

Figure 21:
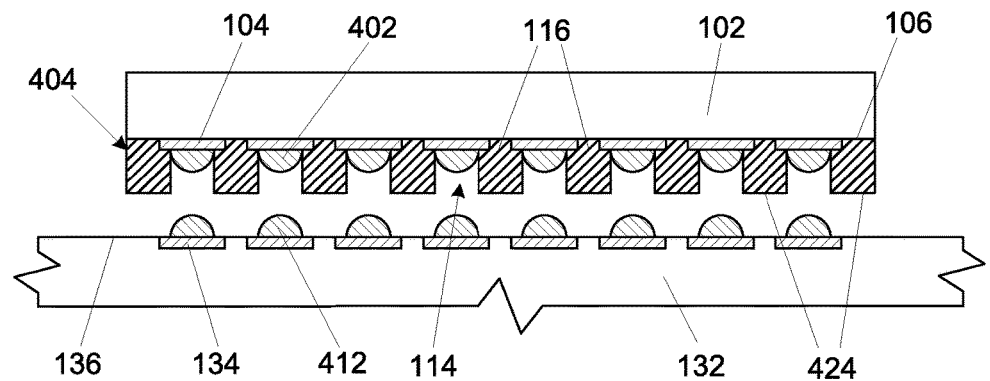
FIGS. 21 and 22 illustrate side cross-sectional views of a process of forming a solder in cavity interconnection structure, according to yet still another embodiment of the present disclosure.
Figure 22:
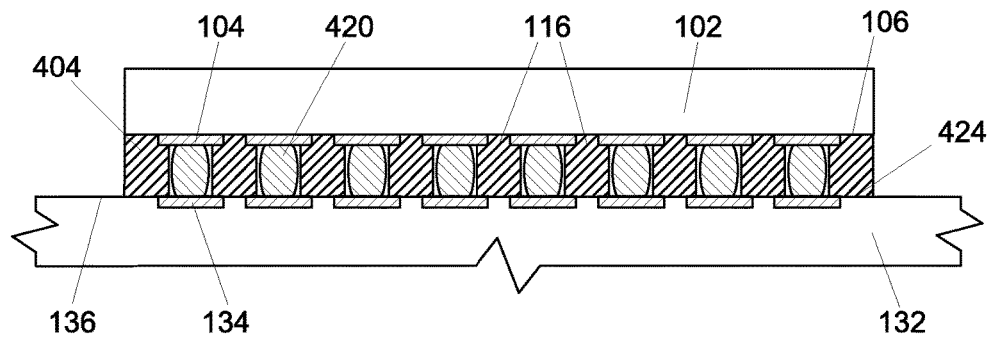

In one embodiment illustrated in FIGS. 21 and 22, the second solder structures 412 may be formed on the second substrate contact lands 134 with the second dielectric 414 (see FIG. 17) not used or having been removed. In this embodiment, the inter-cavity walls 116 of the first dielectric layer 404 may have contact surfaces 424 formed between each of the adjacent cavities 114 which may be substantially planar to the first substrate contact surface 106, such as previously discussed with regard to the embodiment illustrated in FIG. 11. As shown in FIG. 22, the first solder structures 402 may be aligned with the second solder structures 404, wherein the contact surfaces 424 of the intervening inter-cavities walls 116 contact the second substrate contact surface 136. The first solder structures 402 and corresponding second solder structures 412 may be attached to one another to form interconnects 420 by any known technique, including but not limited to reflow or thermal compression bonding, as further shown in FIG. 22. It is understood that an underfill material could be used, such as shown in FIGS. 18-20 to fill voids and provides a more robust package, as previously discussed.

Figure 23:
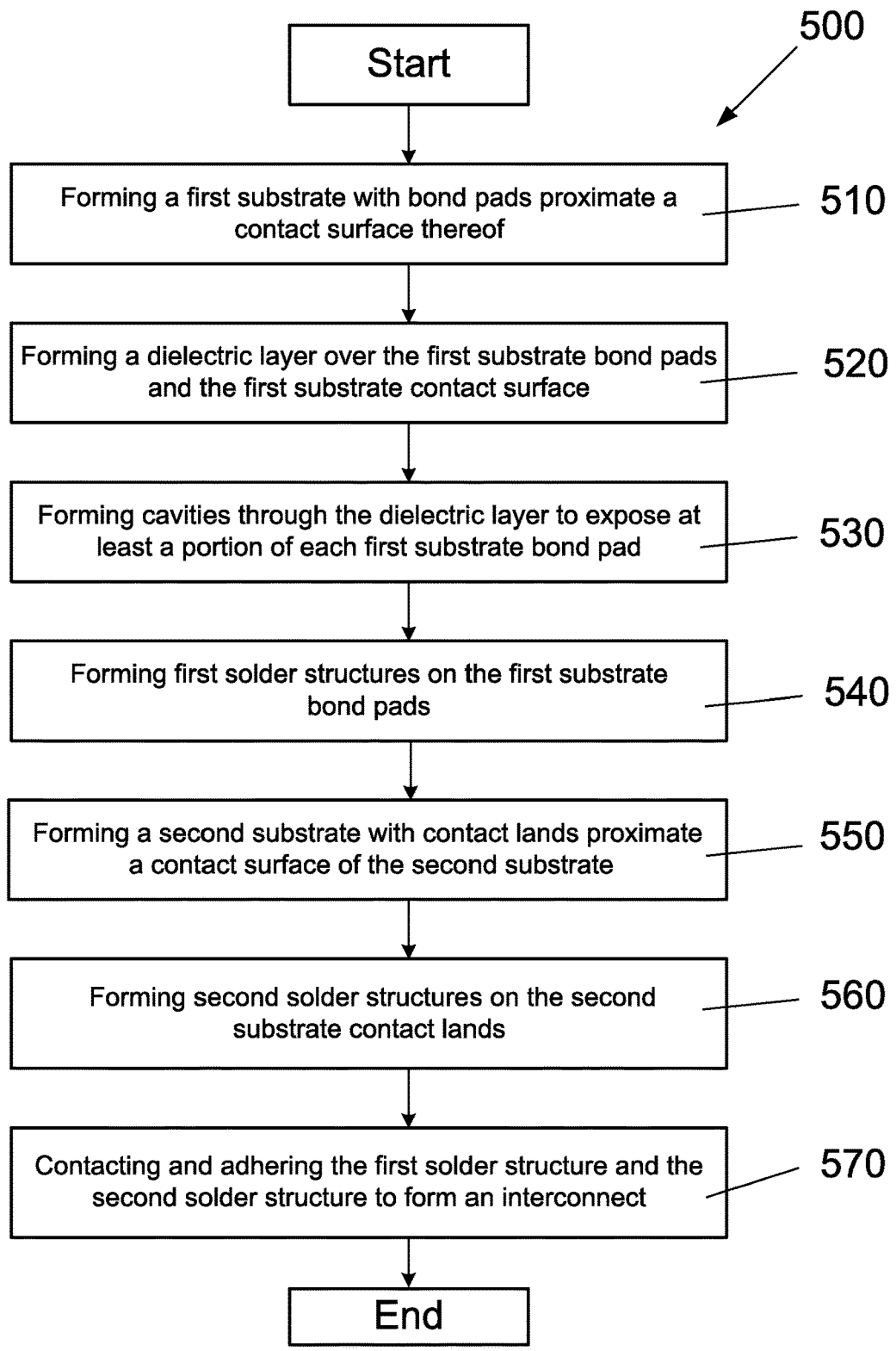
FIG. 23 is a flow diagram of a process of forming a solder in cavity interconnection structure, according to an embodiment of the present disclosure.

An embodiment of a process of the present description is illustrated in the flow diagram 500 of FIG. 23. As shown in block 510, a first substrate may be formed with bond pads proximate a first surface thereof. A first dielectric layer may be formed over the first substrate bond pads and the first substrate contact surface, as defined in block 520. As defined in block 530, cavities may be formed through the first dielectric layer to expose at least a portion of each first substrate bond pad. First solder structures may be formed on the first substrate bond pads, as defined in block 540. As defined in block 550, a second substrate may be formed with contact lands proximate a contact surface of the second substrate. As defined in block 560, second solder structures may be formed on the contact lands on the contact surface of the second substrate. As defined in block 570, the first solder structures may be brought into contact with the second solder structures and adhered together to from interconnection structures.

Although the described embodiments within this description are directed to a first substrate and a second substrate, it is understood that the concepts apply equally to any microelectronic packaging process., including but not limited to First Level Interconnects (FLI) where microelectronic dice are attached to substrates or interposers, to Second Level Interconnects (SLI) where substrates or interposers are attached to a board or a motherboard, and to Direct Chip Attach (DCA) where microelectronic dice are attached directly to a board or a motherboard.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic device, comprising:
   a first substrate having a plurality of bond pads proximate a first surface of the first substrate;
   a first dielectric layer disposed over the first substrate bond pads and the first substrate contact surface, wherein the first dielectric layer includes a plurality of cavities extending therethrough to corresponding bond pads;
   a second substrate having a plurality of contact lands proximate a contact surface of the second substrate;
   a second dielectric layer on the second substrate surface adjacent the plurality of second substrate contact lands, wherein the second dielectric layer includes a plurality of cavities extending therethrough to corresponding contact lands;
   a solder interconnection between the first substrate bond pads and the second substrate contact lands;
   an underfill material between the first dielectric layer and the second dielectric layer, wherein a portion of the underfill material extends into the plurality of cavities extending through the first dielectric layer and wherein another portion of the underfill material extends into the plurality of cavities extending through the second dielectric layer.

2. The microelectronic device of claim 1, wherein the plurality of cavities extending through the first dielectric layer each include at least one sidewall, and wherein the at least one sidewall is substantially perpendicular to the first substrate contact surface.

3. The microelectronic device of claim 1, wherein the plurality of cavities extending through the second dielectric layer each include at least one sidewall, and wherein the at least one sidewall is substantially perpendicular to the first substrate contact surface.

4. The microelectronic device of claim 1, wherein the first substrate comprises a microelectronic die.

5. The microelectronic device of claim 1, wherein the second substrate comprises an interposer.

6. The microelectronic device of claim 1, wherein the second dielectric layer comprises a solder mask photoresist material.

7. The microelectronic device of claim 1, wherein the underfill material comprises an epoxy material.

8. The microelectronic device of claim 2, wherein the portion of the underfill material contacts the at least one sidewall of each of the plurality of cavities of the first dielectric layer.

9. The microelectronic device of claim 2, wherein the another portion of the underfill material contacts the at least one sidewall of each of the plurality of cavities of the second dielectric layer.

10. The microelectronic device of claim 1, wherein the portion of the underfill material extending into the plurality of cavities extending through the first dielectric layer contacts the first substrate bond pads.

11. The microelectronic device of claim 1, wherein the another portion of the underfill material contacts the second substrate contact lands.

* * * * *